United States Patent [19]
Myers

[11] Patent Number: 5,184,127
[45] Date of Patent: Feb. 2, 1993

[54] SAMPLE-AND-HOLD DROOP COMPENSATOR FOR HIGH SPEED HIGH RESOLUTION ANALOG-TO-DIGITAL CONVERTER

[75] Inventor: Terrence L. Myers, Fullerton, Calif.

[73] Assignee: Hughes Aircraft Company, Los Angeles, Calif.

[21] Appl. No.: 687,803

[22] Filed: Apr. 19, 1991

[51] Int. Cl.$^5$ .............................................. H03M 1/06
[52] U.S. Cl. ..................................... 341/122; 341/118
[58] Field of Search ................ 341/118, 120, 122, 124

[56] References Cited

U.S. PATENT DOCUMENTS

| | | | |
|---|---|---|---|
| 3,982,241 | 9/1976 | Lipcon | 341/118 |
| 4,191,942 | 3/1980 | Long | 341/122 |
| 4,528,549 | 7/1985 | Simpson | 341/122 |
| 4,590,458 | 5/1986 | Evans et al. | 341/118 |
| 4,734,677 | 3/1988 | Cake et al. | 341/122 |
| 4,947,168 | 8/1990 | Myers | 341/120 |

Primary Examiner—A. D. Pellinen
Assistant Examiner—Marc S. Hoff
Attorney, Agent, or Firm—Wanda K. Denson-Low

[57] ABSTRACT

A sample-and-hold droop compensation circuit including a ramp generator for producing a ramp signal synchronized with the hold timing of a sample-and-hold circuit and adjusted so as to tend to compensate the droop in the sample-and-hold output, circuitry for adding the ramp signal to the output of the sample-and-hold circuit to produce a sum signal, and a quantizer for providing a digital representation of the sum signal. The slope of the ramp signal is adjusted by a microcomputer by providing a reference input to the sample-and-hold circuit, determining the change in time of the sum signal, and adjusting the ramp signal so as to reduce the slope of the sum signal.

5 Claims, 4 Drawing Sheets

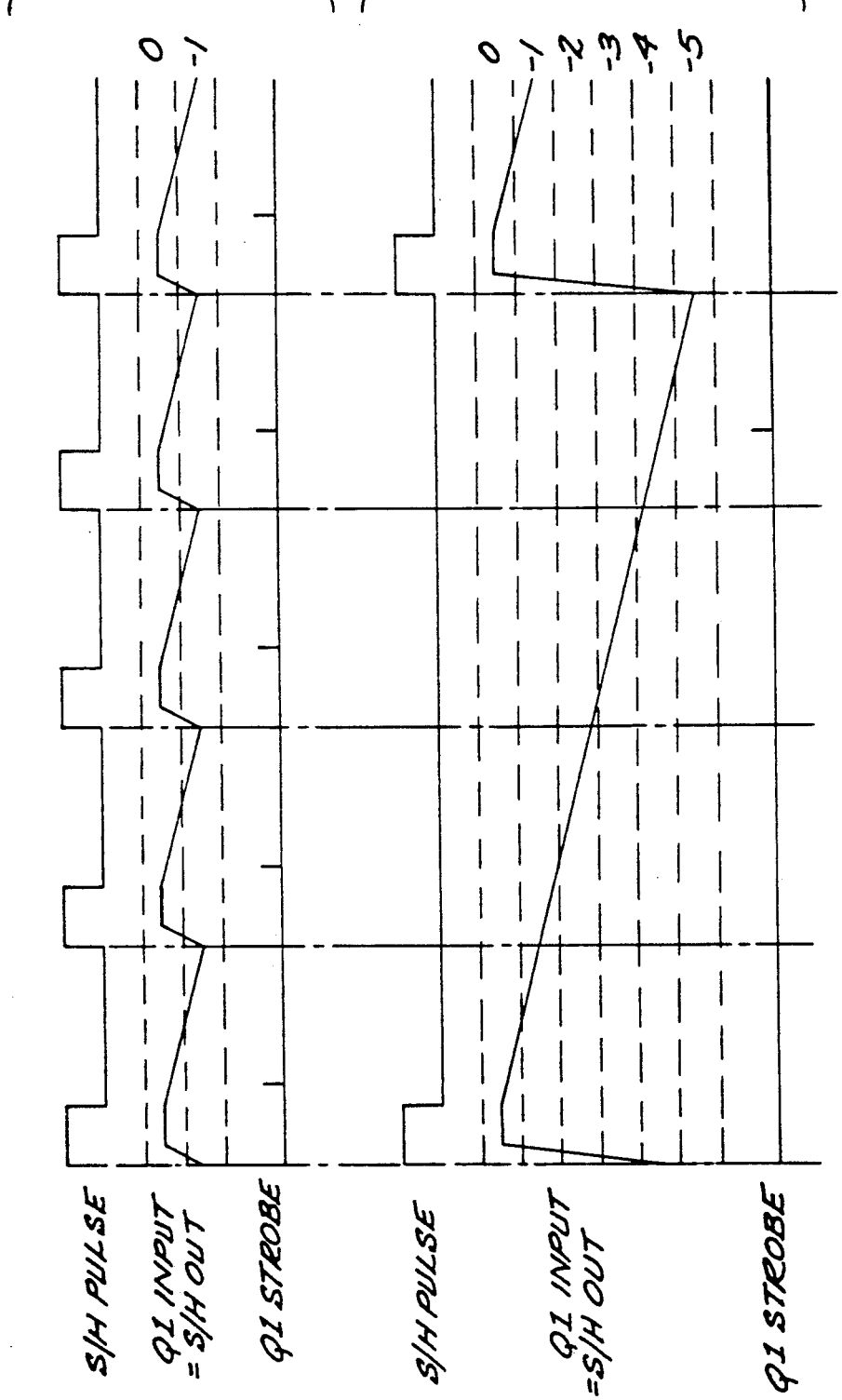

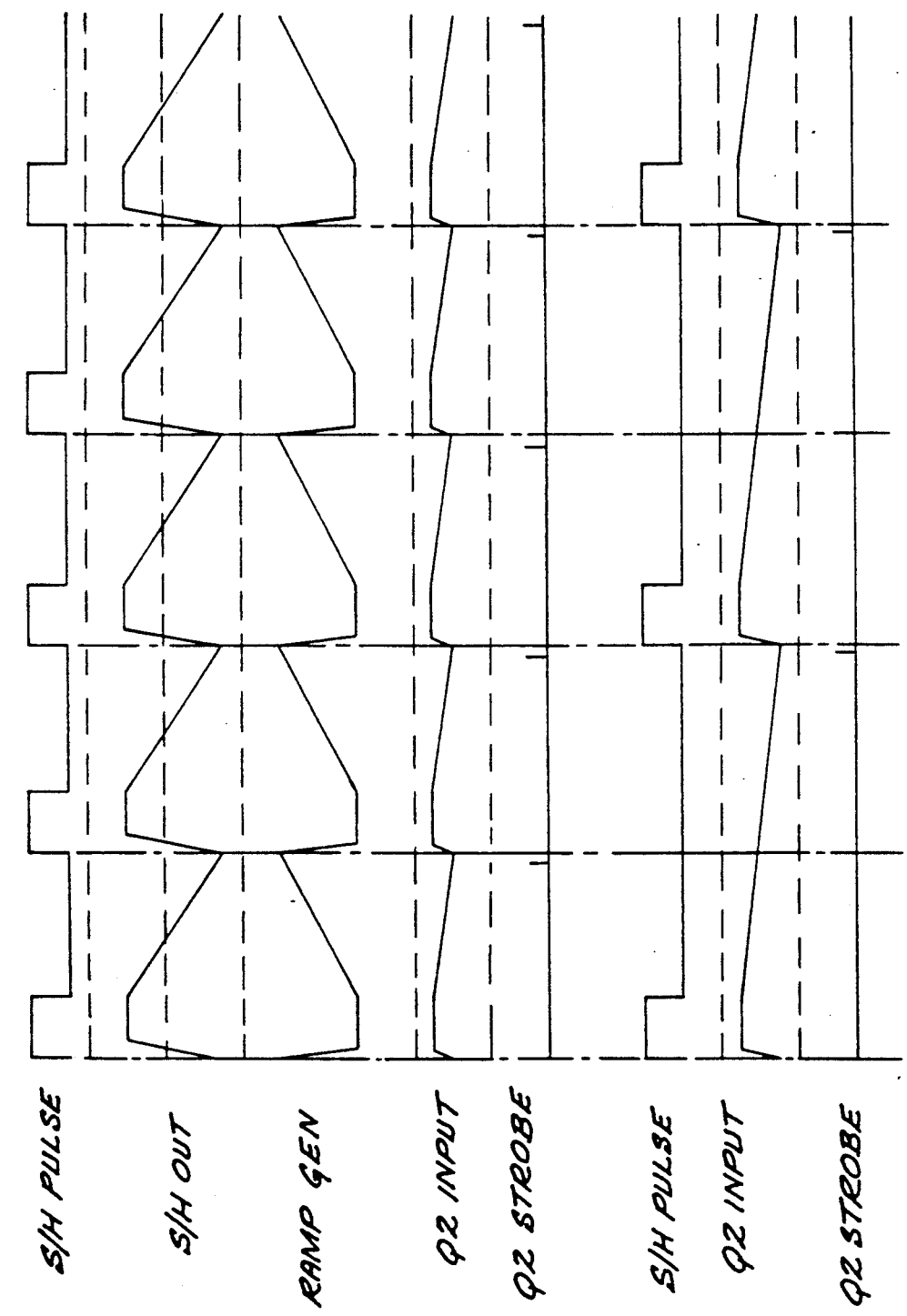

SAMPLE-AND-HOLD DROOP COMPENSATOR FOR HIGH SPEED HIGH RESOLUTION ANALOG-TO-DIGITAL CONVERTER

BACKGROUND OF THE INVENTION

The subject invention is generally directed to sample-and-hold circuitry, and is directed more particularly to droop compensation circuitry for sample-and-hold circuits.

Sample-and-hold circuits are utilized in various applications including analog-to-digital conversion of video signals, which generally requires the use of a sample-and-hold circuit that is capable of maintaining a substantially constant output during the course of the conversion process.

A video speed sample-and-hold circuit generally consists of a buffer amplifier followed by an electronic sampling switch, a capacitor to hold the sampled voltages and an output amplifier to read the capacitor voltage into an analog-to-digital converter. Droop occurs when charge leaks off of the capacitor during the hold phase of the sampling cycle. Excessive droop interferes with accurate quantization by the analog-to-digital converter.

The problem of sample-and-hold droop has been addressed in a number of different ways. The most obvious is simply to use a hold amplifier for which the input bias current is negligibly small. Amplifiers with field-effect input stage transistors have almost zero input current, but they generate too much noise to be useful in broadband, high resolution converters. Bipolar transistors generate much less noise, but their base currents are of appreciable magnitude and are also temperature dependent. The problem is compounded by the need to keep the hold capacitance small to facilitate fast acquisition of new voltage samples within the current limitations imposed by realizable sampling switches and buffer amplifiers. Furthermore, if the hold amplifier is to settle quickly, its transistors bias currents, including the input base current, will tend to be larger.

Bias current cancellation schemes have been devised which attempt to develop a current source that can be connected to the hold node to supply exactly the amount of current demanded by the hold amplifier. Temperature tracking is maintained by use of monolithic construction and matching transistor geometries. The weakness of this approach is that it requires the use of a transistor current mirror, and at high video slew rates significant charge can be pumped into the mirror structure through parasitic capacitance. This manifests itself as rapidly deteriorating harmonic distortion performance for input video frequencies approaching half the sample rate.

SUMMARY OF THE INVENTION

It would therefore be an advantage to overcome the consequences of sample-and-hold droop in a high speed, high resolution analog-to-digital converter without incurring the penalties of increased noise or increased harmonic distortion that are associated with existing techniques.

The foregoing and other advantages are provided by the invention in a droop compensation circuit that includes a digitally controlled ramp generator for providing a ramp signal that is summed with the sample-and-hold output. The slope of the ramp signal is controlled so as to reduce the effects of the droop to within the normal correction range of the associated subranging analog-to-digital converter.

The subject invention can be implemented without the need to develop custom monolithic integrated circuits, and it permits the development of a high-performance analog-to-digital conversion subsystem based on component parts that are already commercially available.

This invention helps to overcome the remaining obstacle in the development of a practical high resolution, video bandwidth analog-to-digital converter subsystem. Using autocalibration techniques has made it practical to perform fast, accurate conversions, but available sample-and-hold modules have proven incapable of providing video samples with commensurately low noise and low distortion over the entire bandwidth of interest.

Analog-to-digital converters with the improved performance provided by the invention can be advantageously utilized in military surveillance radar systems which require large dynamic range at low distortion to digitally extract small amplitude target data from relatively large amplitude clutter data and to discriminate against jammers. The number of receiver channels required to obtain equivalent performance in such a radar system is dramatically reduced if it is possible to achieve very high linearity in those receiver channels, up to and including the transition into the digital signal processing domain.

BRIEF DESCRIPTION OF THE DRAWINGS

The advantages and features of the disclosed invention will readily be appreciated by persons skilled in the art from the following detailed description when read in conjunction with the drawing wherein:

FIGS. 3 and 4 are timing diagrams helpful in understanding the coarse calibration procedure of FIG. 2.

FIGS. 5 and 6 are timing diagrams helpful in understanding a fine calibration procedure performed by the droop compensation circuit of FIG 1.

DETAILED DESCRIPTION OF THE DISCLOSURE

Figure 1:
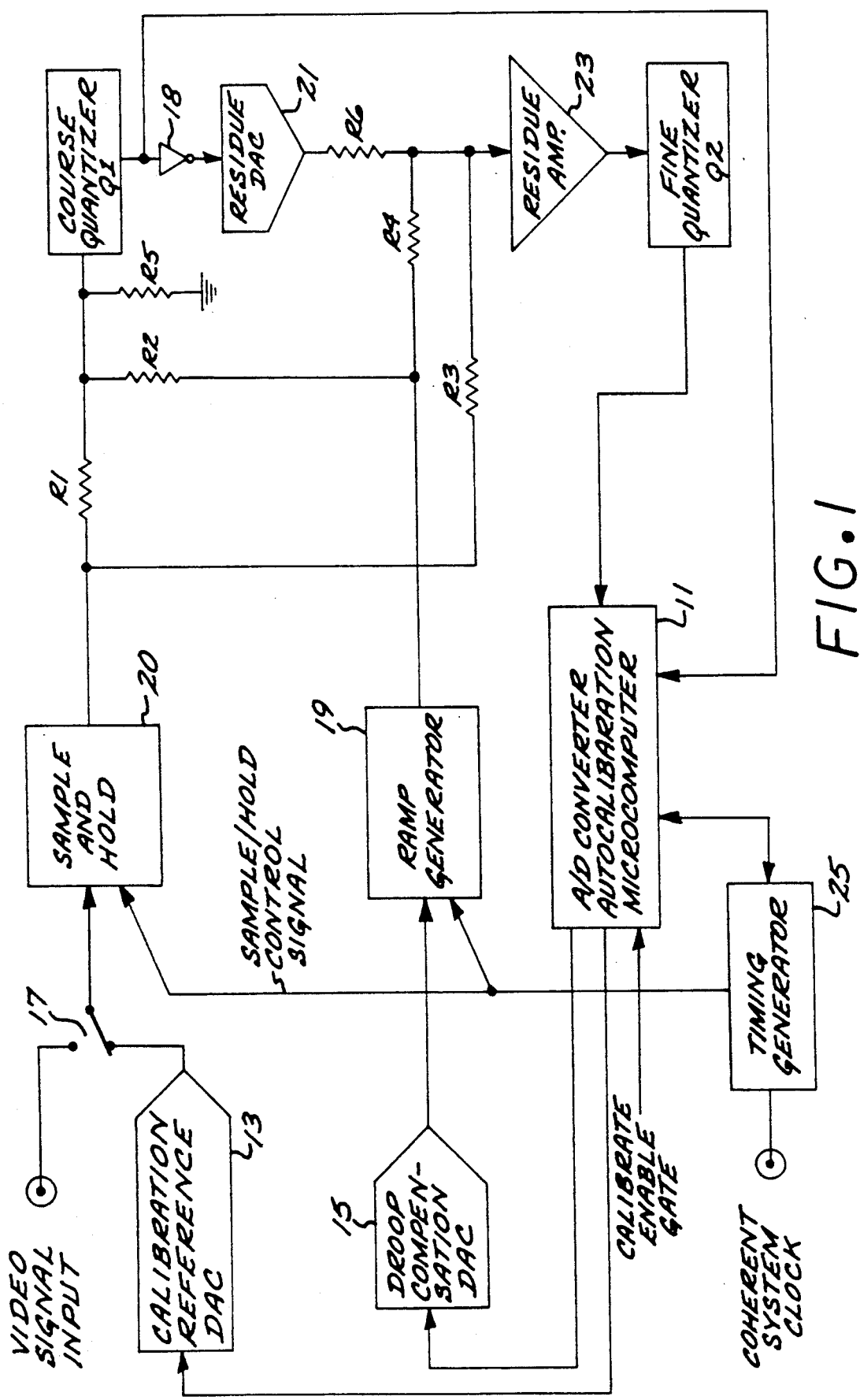
FIG. 1 is a block diagram illustrating a sample-and-hold droop compensation circuit in accordance with the invention.

In the following detailed description and in the several figures of the drawing, like elements are identified with like reference numerals.

Referring now to FIG. 1, set forth therein is an illustrative embodiment of a droop compensator in accordance with the invention for a sample-and-hold circuit 20. The droop compensator includes a microcomputer 11 which provides digital outputs to a calibration reference digital-to-analog converter (DAC) 13 and a droop compensation DAC 15. The output of the calibration reference DAC 13 is provided to a switch 17 which further receives a video signal which is to be quantized. The switch is controlled by the microcomputer 11 so that the input to the sample-and-hold circuit 20 is either the output of the calibration DAC 13 or the video signal to be quantized.

The output of the droop compensation DAC 15 is provided to a ramp generator 19 which provides a ramp signal that is synchronized with the timing of the sample-and-hold circuit so that the ramp signal (a) starts at the same time the sample-and-hold circuit enters the hold mode of operation, and (b) is reset when the sample-and-hold circuit 20 enters the sample mode of operation. The ramp signal and the sample-and-hold output are summed at the input of a coarse quantizer via resistors R2 and R3. A resistor R5 is connected between the input of the coarse quantizer Q1 and ground reference to promote faster settling of the voltage at that node.

Depending upon the particular A/D processing application, the droop compensation circuit can be configured to be unipolar or bipolar. A/D converters designed for bipolar operation are commonly configured such that a zero volt signal input produces a mid-range output code.

It should be appreciated that the slope of the sample-and-hold circuit output resulting from droop will depend on the particular implementation. Assuming that the hold amplifier input stage is a differential pair of NPN bipolar transistors, the voltage droop at the output of the sample-and-hold circuit is likely to have a negative slope. If a PNP pair is used, the slope would be positive. For a transimpedance amplifier having both an NPN and a PNP transistor for its input stage, the slope could be either positive or negative. The ramp generator and the calibration procedures disclosed further herein can easily be designed capable of correcting whichever droop polarity is encountered.

The digital parallel output of the coarse quantizer Q1 is provided as an input to the microcomputer 11 and also to a digital inverter 18 which inverts each of the bits of the output of the coarse quantizer and provides its inverted parallel output to a residue DAC 21. The output of the residue DAC 21, the output of the ramp generator 19, and the output of the sample-and-hold circuit are summed at the input of a residue amplifier 23 via resistors R6, R4, and R3, where R6 represents the equivalent output resistance of the residue DAC 21. As a result of the digital inversion, the input to the residue amplifier 23 represents the residue of the analog to digital conversion sample-and-hold output as modified by the ramp signal, which residue is the difference between (a) the sample-and-hold output as modified by the ramp signal and (b) the analog representation of the output of the quantizer Q1. The output of the residue amplifier 23 provides the input to a fine quantizer whose digital output is provided to the microcomputer 11. Effectively, the digital output of the fine quantizer represents the inaccuracy of the coarse quantizer.

A timing generator 25 which is referenced to a coherent system clock signal provides clocking for the microcomputer 11, and further provides timing for the sample-and-hold circuit 20 and the ramp generator 19 as controlled by the microcomputer 11.

By way of illustrative example, the foregoing droop compensation circuit can be implemented in the context of the analog-to-digital converter described in commonly assigned U.S. Pat. No. 4,947,168, Aug. 7, 1990, incorporated herein by reference.

The droop compensation circuit operates in two modes, the first mode being a calibration mode wherein the slope of the ramp signal is adjusted to compensate for droop encountered for a reference input to the sample-and-hold circuit, and the second mode being a steady state mode wherein the slope of the ramp signal is maintained at the calibrated value. Depending upon the particular application and processing speed, the calibration procedure can be repeated sufficiently often to track changes due to factors such as temperature changes and other operating changes.

Figure 2:
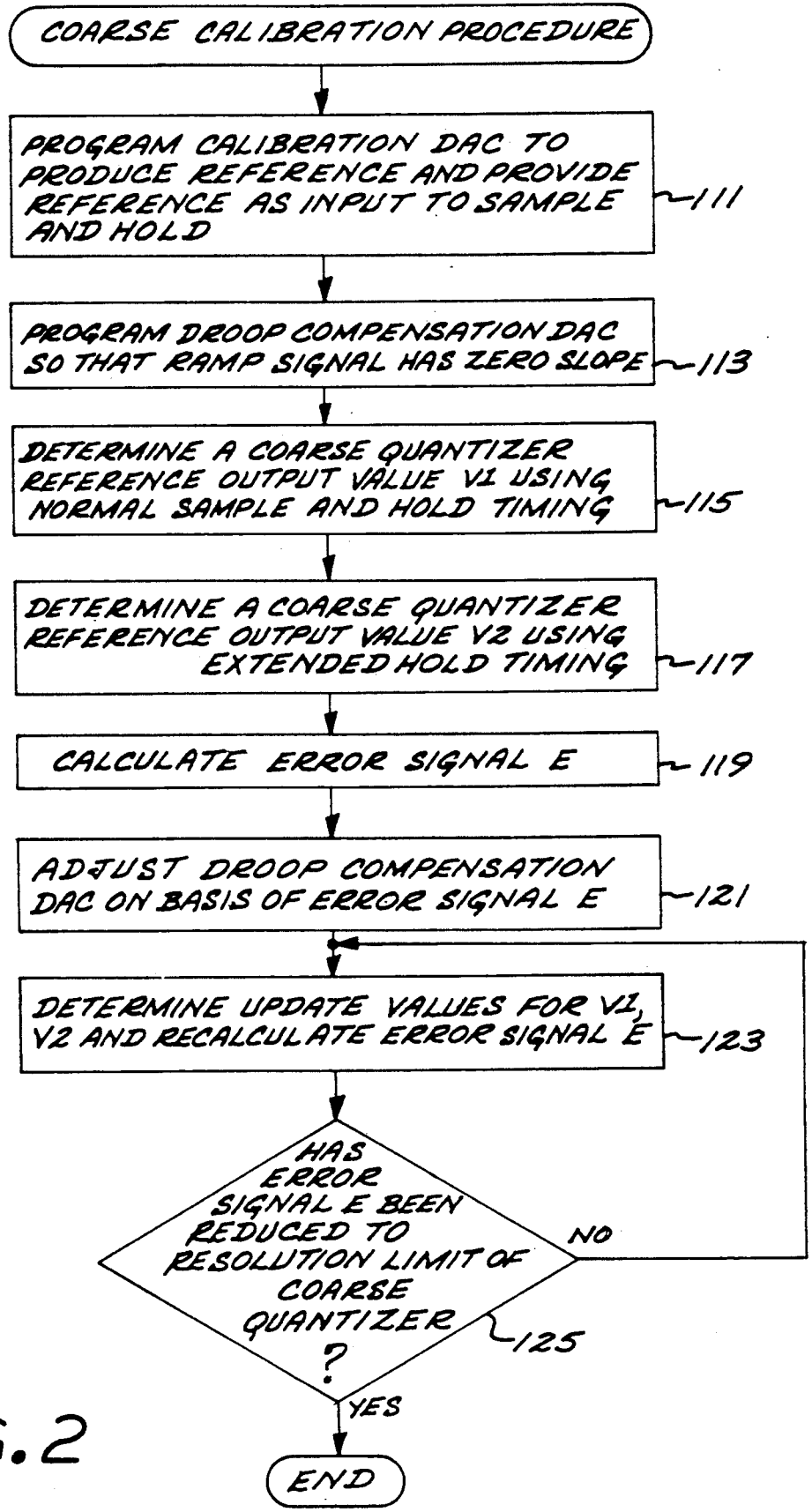
FIG. 2 is a flow diagram of a coarse calibration procedure performed by the droop compensation circuit of FIG. 1.

The calibration mode of operation is enabled in response to a calibrate enable signal that is provided to the microcomputer by external circuitry, and FIG. 2 sets forth a flow diagram of a coarse calibration procedure for adjusting the slope of the ramp signal pursuant to the output of the coarse quantizer Q1. At 111 the calibration DAC 13 is programmed for a reference output which can be 0 volts, and the switch 17 is controlled so that the calibration DAC 13 provides the input to the sample-and-hold circuit 20. It should be appreciated that, depending upon implementation, the calibration DAC 13 can be omitted if the calibration reference input to the sample-and-hold circuit will always be 0 volts, in which case the input to the sample-and-hold circuit 20 would be switched to ground for calibration.

At 113 the droop compensation DAC 15 is programmed such that the ramp generator provides a ramp signal output having a zero slope (i.e., the ramp signal remains at 0 volts). At 115 a first reference value V1 representing the output of Q1 for the calibration DAC reference input to the sample-and-hold circuit is determined using normal sample-and-hold timing (i.e., the timing used for A/D conversion of the video signal) with the droop compensation DAC set so that the ramp generator output is zero. FIG. 3, which includes dashed lines representing the coarse quantizer output levels, schematically illustrates the normal sample-and-hold timing, the input to the coarse quantizer Q1, and the timing of the strobe to the coarse quantizer Q1 for determination of the first reference value V1. The input to the coarse quantizer is the output of the sample-and-hold circuit 20 since the ramp generator output is zero. The coarse quantizer output reference value V1 is can be a sample-and-hold output as captured by the coarse quantizer Q1, or it can be the average of the Q1 captured values for several normal sample-and-hold cycles.

At 117 the sample-and-hold timing is altered to provide (a) an extended hold time that extends over two or more converter cycles and (b) Q1 strobing that occurs near the end of the extended hold period. FIG. 4, which includes dashed lines representing the coarse quantizer output levels, schematically illustrates the extended hold timing, the input to the coarse quantizer Q1, and the timing of the strobe to the coarse quantizer Q1 for the altered sample-and-hold timing. At 119 a second reference value V2 is determined by averaging a plurality of coarse quantizer samples taken pursuant to the altered timing, and at 121 the first reference value V1 (based on normal timing) is subtracted from the second reference value V2 (based on extended hold timing) to provide an error signal E. The reference values V1, V2 represent the change in time of the input to the coarse quantizer Q1 and therefore represent the amount of droop in the output of the sample-and-hold circuit. The error signal E effectively represents the slope of the hold output, given that the change in Q1 strobe timing is known. In other words, the error signal E represents the amount of change in the hold output that takes place over the time interval defined by the delay in the Q1 strobe relative to the normal Q1 strobe timing.

At 123 the input to the droop compensation DAC 15 is adjusted so as to produce a ramp signal having a slope that is opposite to the slope of the hold output as represented by the error signal E. At 125 updated values for the reference values V1, V2 are determined and the error signal E is recalculated. At 127 a determination is made as to whether the error signal E has been reduced to the resolution limit of the coarse quantizer Q1. If no, at 129 the input to the droop compensation DAC 15 is adjusted pursuant to the value of the error signal E, and control transfers to 127.

If the determination at 127 is yes, the error signal E has been reduced to the resolution limit of the coarse quantizer Q1, the coarse calibration procedure ends.

After the error signal E is reduced to the resolution limit of the coarse quantizer, the coarse setting of the calibration DAC arrived at pursuant to the output of the coarse quantizer is utilized as the starting point for a fine calibration procedure that is achieved similarly to the coarse calibration procedure. The reference values for calculating an error signal would be based on the residue inputs provided by the fine quantizer Q2 for normal hold timing and for extended hold timing, and the input to the droop compensation DAC would be adjusted until the error signal E is reduced to the resolution limit of the fine quantizer Q2. FIG. 5 schematically illustrates waveforms representing the normal sample-and-hold timing, the input to the fine quantizer Q2, and the timing of the strobe to the fine quantizer Q2 for determination of the first reference value for fine calibration, and FIG. 6 schematically illustrates the extended hold timing, the input to the fine quantizer Q2, and the timing of the strobe to the fine quantizer Q2 for the altered sample-and-hold timing utilized to determine the second reference value for fine calibration. In FIGS. 5 and 6, the dashed lines represent the coarse quantizer output levels, as in FIGS. 3 and 4.

Effectively, pursuant to calibration, the ramp generator is controlled to produce a ramp signal having a slope that is opposite in sign and scaled to balance the magnitude of the time varying hold output of the sample-and-hold circuit. In this manner, the input to the coarse quantizer Q1 and the fine quantizer Q2 is substantially constant during any given hold time.

While the foregoing droop compensator includes both coarse and fine adjustments, it should be appreciated that, depending upon the particular application, a coarse adjustment may be sufficient, in which case the residue DAC 21, the residue amplifier 23, the fine quantizer Q2, and the resistors R3, R4, R6 would be omitted.

Although the foregoing has been a description and illustration of specific embodiments of the invention, various modifications and changes thereto can be made by persons skilled in the art without departing from the scope and spirit of the invention as defined by the following claims.

What is claimed is:

1. A droop compensation circuit for compensating droop of a sample-and-hold circuit output, comprising:
   ramp generating means for producing a ramp signal synchronized with the hold timing of the sample-and-hold circuit;
   means for adding said ramp signal to the sample-and-hold circuit output to provide an analog sum signal, said ramp signal adjusted so as to tend to compensate the droop in the sample-and-hold circuit output; and
   quantizing means for providing a digital representation of said analog sum signal.

2. The droop compensation circuit of claim 1 further comprising:
   reference means for providing a reference signal to the sample-and-hold circuit;
   processing means for adjusting the slope of said ramp generating means in response to the quantizer output resulting from input of said reference signal to the sample-and-hold circuit, whereby the slope of said ramp generating means is adjusted to compensate the droop of the output of the sample-and-hold circuit for the reference input.

3. The droop compensation circuit of claim 2 wherein said processing means performs said adjustment by determining first and second reference values representative of the change in time of the sum signal while the sample-and-hold circuit is providing a hold output resulting from the reference signal, calculating an error signal from the first and second reference values, and adjusting the slope of the ramp signal so as to reduce the error signal.

4. The droop compensation circuit of claim 3 further including residue means for providing a comparison signal indicative of the inaccuracy of said quantizer, and wherein said processing means adjusts the slope of said ramp signal in response to said comparison signal as it results from input of said reference signal to the sample-and-hold circuit, said adjustment being made after adjustment pursuant to the output of said quantizer.

5. The droop compensation circuit of claim 4 wherein said residue means comprises:
   a digital inverter responsive to the output of said quantizer;
   a residue digital-to-analog converter responsive to the output of said digital inverter;
   means for summing the output of said residue digital-to-analog converter with a signal representative of said analog sum signal to provide an analog residue signal; and
   a fine quantizer responsive to said analog residue signal for providing said comparison signal which is a digital representation of said analog residue signal.

* * * * *